(12) United States Patent
Gani

(10) Patent No.: US 11,069,667 B2
(45) Date of Patent: Jul. 20, 2021

(54) WAFER LEVEL PROXIMITY SENSOR

(71) Applicant: STMicroelectronics Pte Ltd, Singapore (SG)

(72) Inventor: David Gani, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 15/087,959

(22) Filed: Mar. 31, 2016

(65) Prior Publication Data

US 2017/0287886 A1    Oct. 5, 2017

(51) Int. Cl.
| | |
|---|---|
| *H01L 25/16* | (2006.01) |
| *H01L 21/768* | (2006.01) |
| *H01L 23/48* | (2006.01) |
| *H01L 31/02* | (2006.01) |
| *H01L 31/167* | (2006.01) |
| *H01L 31/18* | (2006.01) |

(Continued)

(52) U.S. Cl.
CPC ............ *H01L 25/167* (2013.01); *G01S 17/04* (2020.01); *H01L 21/76898* (2013.01); *H01L 23/481* (2013.01); *H01L 31/02005* (2013.01); *H01L 31/167* (2013.01); *H01L 31/1804* (2013.01); *H01L 31/186* (2013.01); *H01S 5/02325* (2021.01); *H04M 1/026* (2013.01); *G06F 2203/04105* (2013.01)

(58) Field of Classification Search
CPC ... H01L 31/0203; H01L 31/18; H01L 25/167; H01L 924/181; H01L 2224/48091; H01L 2224/49175; H01L 2924/00014; H01L 2924/18; H01L 31/167; H01L 31/02005; H01L 31/1804; H01L 31/186; H01L 21/50; H01L 21/76898; H01L 23/481; G01S 7/481; G01S 17/026; G01S 17/04; H03K 17/941; H03K 2217/94112; H03K 2017/9455; H03K 2217/94026; H01S 5/02248; H04M 1/026; G06F 3/0416; G06F 2203/04105
See application file for complete search history.

(56) References Cited

U.S. PATENT DOCUMENTS

| | | | | |
|---|---|---|---|---|
| 4,001,859 A | * | 1/1977 | Miyoshi | ................ H01L 31/167 |
| | | | | 257/82 |
| 5,291,038 A | * | 3/1994 | Hanamoto | .......... H01L 31/0203 |
| | | | | 257/82 |

(Continued)

FOREIGN PATENT DOCUMENTS

EP         2 955 759       * 12/2015    ......... H01L 31/0203

*Primary Examiner* — Mary A Wilczewski
(74) *Attorney, Agent, or Firm* — Seed IP Law Group LLP

(57) ABSTRACT

Wafer level proximity sensors are formed by processing a silicon substrate wafer and a silicon cap wafer separately, bonding the cap wafer to the substrate wafer, forming an interconnect structure of through-silicon vias within the substrate, and singulating the bonded wafers to yield individually packaged sensors. The wafer level proximity sensor is smaller than a conventional proximity sensor and can be manufactured using a shorter fabrication process at a lower cost. The proximity sensors are coupled to external components by a signal path that includes the through-silicon vias and a ball grid array formed on a lower surface of the silicon substrate. The design of the wafer level proximity sensor passes more light from the light emitter and more light to the light sensor.

19 Claims, 6 Drawing Sheets

(51) Int. Cl.
  *H01S 5/022*    (2021.01)
  *H04M 1/02*     (2006.01)
  *G06F 3/041*    (2006.01)
  *G01S 17/04*    (2020.01)
  *H01S 5/02325*  (2021.01)

(56) References Cited

U.S. PATENT DOCUMENTS

| | | | | |
|---|---|---|---|---|
| 5,382,810 A * | 1/1995 | Isaksson | | H01L 25/167 |
| | | | | 257/433 |
| 6,486,467 B1 * | 11/2002 | Speckbacher | | G01D 5/34715 |
| | | | | 250/231.16 |
| 7,030,359 B2 * | 4/2006 | Romhild | | G01S 7/4811 |
| | | | | 250/214 R |
| 7,067,926 B2 | 6/2006 | Yamazaki et al. | | |
| 7,078,671 B1 * | 7/2006 | Sherrer | | G02B 6/3636 |
| | | | | 250/216 |
| 8,053,800 B2 * | 11/2011 | Horio | | H01L 31/167 |
| | | | | 250/221 |
| 8,324,602 B2 * | 12/2012 | Wiese | | H01L 31/173 |
| | | | | 250/551 |
| 8,604,436 B1 * | 12/2013 | Patel | | H03K 17/941 |
| | | | | 250/338.1 |
| 8,669,631 B2 * | 3/2014 | Koseki | | H04N 5/2257 |
| | | | | 257/434 |
| 8,779,361 B2 * | 7/2014 | Costello | | H01L 31/173 |
| | | | | 250/338.1 |
| 8,779,443 B2 * | 7/2014 | Wong | | H01L 25/167 |
| | | | | 257/84 |
| 9,030,832 B2 * | 5/2015 | Kwong | | H01L 31/167 |
| | | | | 361/749 |
| 9,136,292 B2 * | 9/2015 | Coffy | | H01L 25/167 |
| 9,269,848 B2 * | 2/2016 | Lermer | | H01L 25/167 |
| 9,281,301 B2 * | 3/2016 | Haslbeck | | H01L 31/0203 |
| 9,305,967 B1 * | 4/2016 | A Tharumalingam | | G01V 8/12 |
| 9,322,901 B2 * | 4/2016 | Kerness | | G01S 17/026 |
| 9,606,231 B2 * | 3/2017 | Halbritter | | G02B 5/10 |
| 9,627,572 B2 * | 4/2017 | Okushiba | | H01L 31/173 |
| 9,705,025 B2 * | 7/2017 | Tu | | H01L 31/0203 |
| 9,842,946 B2 * | 12/2017 | Minixhofer | | H01L 31/0203 |
| 10,720,545 B2 * | 7/2020 | Utsumi | | H01L 31/02005 |
| 2004/0077121 A1 * | 4/2004 | Maeda | | H01L 27/148 |
| | | | | 438/75 |
| 2009/0166785 A1 * | 7/2009 | Camacho | | H01L 21/6835 |
| | | | | 257/433 |
| 2010/0187557 A1 * | 7/2010 | Samoilov | | H01L 27/144 |
| | | | | 257/99 |
| 2011/0057129 A1 * | 3/2011 | Yao | | G01S 17/48 |
| | | | | 250/552 |
| 2013/0001398 A1 * | 1/2013 | Wada | | G01S 17/48 |
| | | | | 250/206.1 |
| 2013/0009173 A1 * | 1/2013 | Vittu | | G01S 7/4813 |
| | | | | 257/82 |
| 2013/0119282 A1 * | 5/2013 | Jin | | H01L 31/0232 |
| | | | | 250/578.1 |
| 2013/0164867 A1 * | 6/2013 | Ramasamy | | H01L 27/14618 |
| | | | | 438/25 |
| 2013/0248887 A1 * | 9/2013 | Coffy | | G01S 7/481 |
| | | | | 257/81 |
| 2013/0334445 A1 * | 12/2013 | Tharumalingam | | H01L 25/165 |
| | | | | 250/552 |
| 2013/0341650 A1 * | 12/2013 | Peng | | H01L 31/0203 |
| | | | | 257/82 |
| 2014/0084308 A1 * | 3/2014 | Wong | | G01S 7/4813 |
| | | | | 257/84 |
| 2014/0231635 A1 * | 8/2014 | Kerness | | G01S 17/026 |
| | | | | 250/226 |
| 2015/0061102 A1 * | 3/2015 | Lin | | H01L 21/76898 |
| | | | | 257/692 |
| 2015/0207016 A1 * | 7/2015 | Tharumalingam | | H01L 24/97 |
| | | | | 438/25 |
| 2016/0061653 A1 * | 3/2016 | Chang | | H01L 25/167 |
| | | | | 250/237 R |
| 2016/0126403 A1 * | 5/2016 | Tu | | H01L 31/173 |
| | | | | 257/82 |
| 2016/0141440 A1 * | 5/2016 | Chun | | H01L 31/12 |
| | | | | 257/82 |
| 2016/0146639 A1 * | 5/2016 | Chan | | G01S 17/04 |
| | | | | 250/393 |
| 2016/0187530 A1 * | 6/2016 | Ma | | H01L 31/167 |
| | | | | 257/82 |
| 2016/0233260 A1 * | 8/2016 | Yiu | | H01L 27/14632 |
| 2016/0284900 A1 * | 9/2016 | Konig | | H01L 31/068 |
| 2016/0284920 A1 * | 9/2016 | Saugier | | H01L 31/167 |
| 2016/0306042 A1 * | 10/2016 | Schrank | | H01L 31/02164 |
| 2016/0307957 A1 * | 10/2016 | A Tharumalingam | | G01S 17/04 |
| 2017/0125613 A1 * | 5/2017 | Minixhofer | | H01L 31/1876 |
| 2018/0292568 A1 * | 10/2018 | Chen | | G01S 7/4813 |
| 2019/0288155 A1 * | 9/2019 | Renard | | H01S 5/02326 |

* cited by examiner

WAFER LEVEL PROXIMITY SENSOR

BACKGROUND

Technical Field

The present disclosure generally relates to sensor technology.

Description of the Related Art

Electronic sensor technology is currently being incorporated into many consumer products, including automobiles, appliances, and mobile devices such as smart phones. Electronic micro-sensor devices can be used to detect environmental conditions such as temperature, humidity, rainfall, sounds, and the like. Such devices can also be used to detect modes of operation of consumer appliances in which they are installed, such as the orientation of a smart phone, use of voice commands, ambient light, and the like. Micro-sensors offer many advantages due to their size, reliability, and low cost. As electronic micro-sensors become smaller and less expensive, they are in higher demand.

One example of an electronic micro-sensor is a proximity sensor that detects the presence of nearby objects without a need for physical contact. Some proximity sensors emit a light beam that is reflected from a target object. The reflected light beam is then captured by the proximity sensor and compared with the emitted beam or with an ambient light level to detect changes that can yield information about the target object.

BRIEF SUMMARY

A miniature proximity sensor suitable for use in smart phones is integrated into a silicon substrate at the wafer level. The wafer level proximity sensor can detect whether or not a smart phone user is holding the phone up to their ear. If so, the touch screen can be disabled until the phone is moved away from the user's head. Once the proximity sensor no longer senses the presence of the user's head next to the touch screen, the touch screen can be re-enabled. The miniature proximity sensor therefore permits the user to conduct a telephone call without inadvertently selecting other functions from the touch screen of the phone, which might otherwise interrupt the call.

The wafer level proximity sensor is smaller than a conventional proximity sensor, and it can be manufactured using a shorter fabrication process, and therefore also at a lower cost. An array of proximity sensors is formed by processing a silicon substrate and a silicon cap separately, gluing the cap to the substrate, and forming an interconnect structure of through-silicon vias within the substrate. A light sensor and a light emitter are formed on, or attached to, the substrate, and connected to external components by a signal path that includes the through-silicon vias and a ball grid array formed on a lower surface of the silicon substrate. The design of the wafer level proximity sensor may receive more light from the light emitter and may permits more light to reach the light sensor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
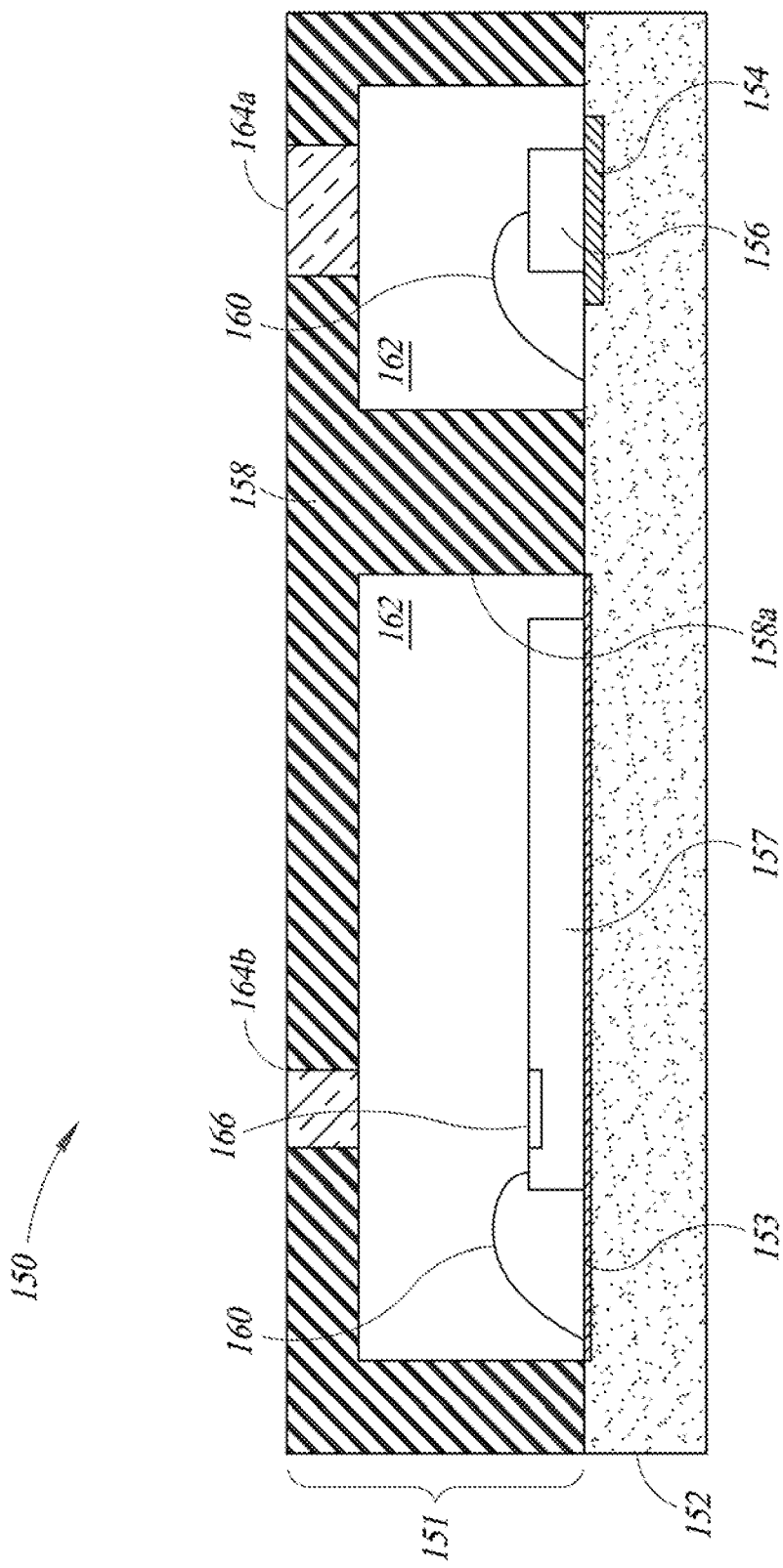
FIG. 1 is a cross-sectional view of a conventional proximity micro-sensor according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to forming layers on a silicon substrate may entail the use of conventional thin film deposition techniques for depositing silicon nitride, silicon dioxide, metals, or similar materials, including such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, may include a spin-expose-develop process sequence typically followed by an etch process. Alternatively or additionally, photoresist can also be used to pattern a hard mask, e.g., a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to proximity sensors that have been produced; however, the present disclosure and the reference to certain materials, dimensions, and the details and ordering of processing steps are exemplary and should not be limited to those shown.

Turning now to the figures, FIG. 1 shows an example of a conventional proximity micro-sensor module 150. The conventional proximity micro-sensor module 150 is housed inside a chip package 151 that is mounted on a substrate 152, e.g., a printed circuit board. The substrate 152 can be made of a ceramic material, or an organic, carbon-based material, as is known in the art. A typical chip package 151 is in the range of 2.0-4.0 mm wide and about 0.7-1.0 mm tall.

The chip package 151 includes conductive traces 153, a metal pad 154, integrated circuit dies 156 and 157, and a cap 158. The conductive traces 153 carry electrical signals from the integrated circuit dies 156, 157 to connect with external devices via bond wires 160. The metal pad 154 is integrated with the substrate 152 to support the integrated circuit die 156. The cap 158 is spaced apart from the integrated circuit dies by a light transmitting region 162, about 0.5-0.9 mm high. The light transmitting region 162 may be filled with air, or it may be filled with a molded transparent layer that is made of silicon, or an epoxy-based transparent material, or the like. The cap 158 covers the integrated circuit dies 156, 157 to protect the dies from contamination. The cap 158 can be made of molded plastic or metal, for example, using an exposed die molding process, which is well known in the art. The process of exposed die molding may entail forming a two-layer cap that includes a transparent layer covered by an opaque layer.

In the conventional proximity micro-sensor module 150, the die 156 is a transmitter die and the die 157 is a sensor receiver die. The transmitter die 156 transmits a signal out from the conventional proximity micro-sensor module 150 through a first opening 164a in the cap 158. The transmitter die 156 includes a light source. The first opening 164a may be about 0.4-0.5 mm wide. The sensor receiver die 157 senses light that enters the chip package 151 through a second opening 164b in the cap 158. The second opening 164b may be about 0.2 mm wide. The first and second openings 164a, 164b can be glass windows or lenses. The transmitter die 156 is separated from the sensor receiver die 157 by a vertical member 158a of the cap 158. The vertical member 158a serves as a light barrier preventing light emitted from the transmitter die 156 from propagating directly to the sensor receiver die 157 along a horizontal path. The sensor receiver die 157 includes a light sensor 166. The light sensor 166 is mounted on a top surface of the sensor receiver die 157, underneath and aligned with the second opening 164b.

Figure 2:
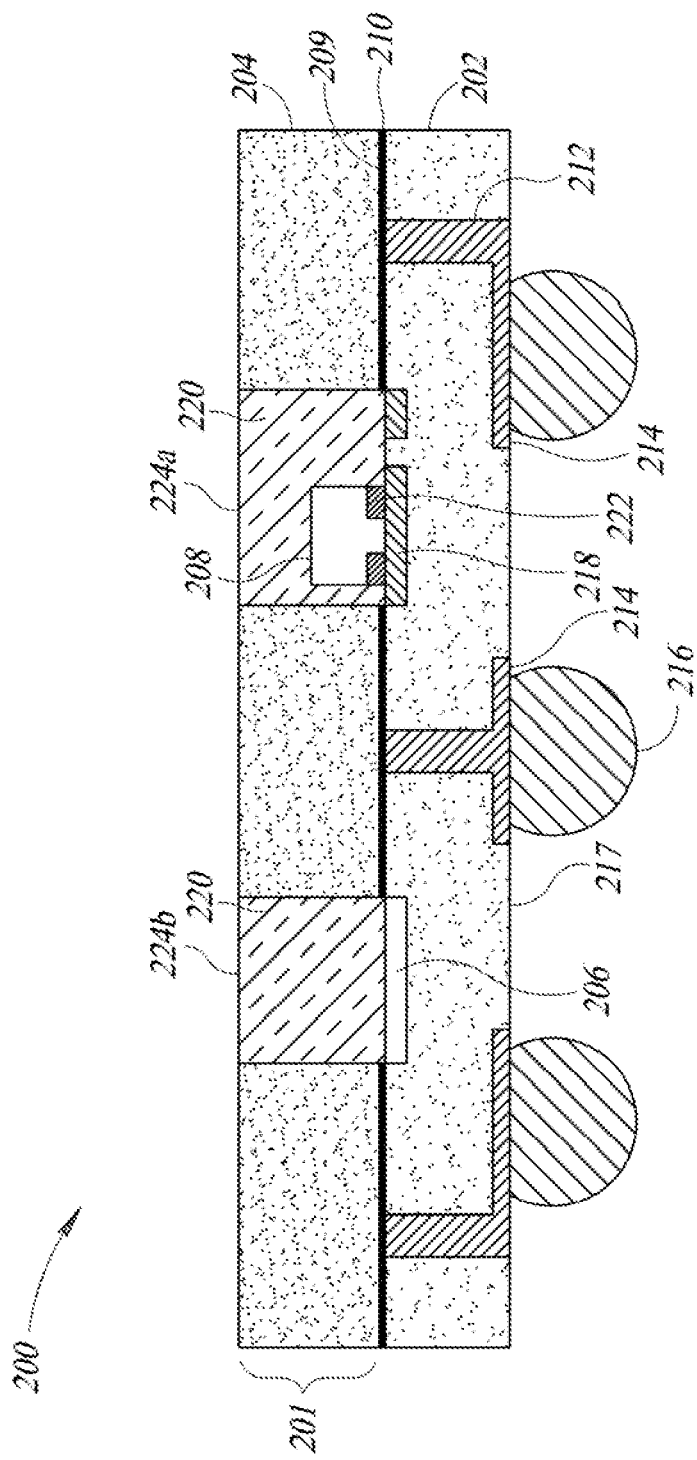
FIG. 2 is a cross-sectional view of a completed wafer level proximity sensor according to an embodiment as described herein.

FIG. 2 shows a wafer level proximity micro-sensor module 200, according to one embodiment. Wafer level proximity micro-sensor modules 200 are fabricated as integrated sensor packages. First, a silicon substrate wafer 202 and a silicon cap wafer 204 are processed separately. The separate wafers are then bonded to form a bonded wafer sandwich. Upper and lower surfaces of the bonded wafer sandwich are then processed further, and finally, the bonded wafer sandwich is singulated into the individual proximity micro-sensor modules 200.

The resulting wafer level proximity micro-sensor module 200 has many advantages over the conventional proximity micro-sensor module 150. For example, the wafer level proximity micro-sensor module 200 is smaller, less expensive to manufacture than the conventional proximity micro-sensor module 150.

With reference to FIG. 2, a singulated wafer level proximity micro-sensor module 200 is housed inside a miniature wafer level chip package 201 that is mounted on a silicon substrate 202. The wafer level chip package 201 includes a silicon cap 204 and integrated circuit dies 206 and 208. The silicon cap 204 has a lower surface 209. The miniature wafer level chip package 201 is attached to the silicon substrate 202 by a thin glue layer 210. The miniature wafer level chip package 201 is in the range of 1.4-1.6 mm wide and about 0.2-0.3 mm thick. The silicon substrate 202 is also about 0.2-0.3 mm thick, so that the total thickness of the wafer level proximity micro-sensor module 200, including the wafer level chip package 201 and the silicon substrate 202, is in the range of about 0.4-0.6 mm—about half as thick as the conventional proximity micro-sensor module 150. The reduced thickness makes the wafer level proximity micro-sensor module 200 particularly suitable for mobile devices such as smart phones that are desirably thin.

The silicon substrate 202 houses an interconnect structure of metal conduits in the form of a network of traces, through-silicon vias (TSVs) 212, and lower contact pads 214, as is known in the art. The TSVs extend all the way through the silicon substrate 202 from the top surface of the substrate 202 to the bottom surface of the substrate 202. Portions of the TSVs may be in abutting contact with one or more of the upper contact pads 218, the lower contact pads, 214, the solder balls 216, and the integrated circuit dies 206 and 208. Traces (not shown) that lie in a plane parallel to the cross-sectional plane of the drawings may connect the TSVs 212 to the integrated circuit dies 206 and 208 near the surface of the substrate 202. The through-silicon vias 212 and lower contact pads 214 carry electrical signals from the integrated circuit dies 206 and 208 to connect with external devices via solder balls 216. The solder balls 216 may be arranged in a ball grid array that is patterned on a lower surface 217 of the silicon substrate 202 as is known in the art. In one embodiment, the solder balls 216 have diameters of about 0.25 mm and are spaced apart such that the center-to-center pitch of adjacent solder balls 216 is in the range of about 0.35-0.40 mm. The total thickness of the wafer level proximity micro-sensor module 200 including the solder balls is therefore in the range of about 0.6-0.8 mm.

In the wafer level proximity micro-sensor module 200, the die 208 is a transmitter die and the die 206 is a light sensor array. The transmitter die 208 transmits light outward from the wafer level proximity micro-sensor module 200 through a first opening 224a in the cap 204. The transmitter die 208 includes a light source, e.g., a light-emitting diode or a laser diode. The transmitter die 208 is structurally and electrically coupled to the silicon substrate 202 by an upper contact pad 218 which is in turn coupled to a through-silicon via 212. A metallic layer 222 may couple the transmitter die 208 to the contact pad 218. The light sensor array 206 senses light that enters the wafer level chip package 201 through a second opening 224b in the cap 204. Signals received by the light sensor array 206 can be time-correlated with signals transmitted by the transmitter die 208 to distinguish relevant reflected light signals from non-relevant ambient light signals that come from external sources. Unlike the conventional proximity micro-sensor module 150, the silicon cap 204 does not cover any portion of the integrated circuit dies 206, 208.

The light sensor array 206 may sense light, for example, using a photodetector to count photons, e.g., a photodiode. If an object is present within about 20-30 cm of wafer level proximity micro-sensor module 200, the object will reflect some or all of the light so that the number of photons reaching the light sensor array 206 will increase. Alternatively, the light sensor array 206 may be a time-of-flight type sensor that senses a signal from the transmitter die 208 that is reflected from a target. The target location can be such that the total distance traveled by the emitted photons is up to 50 cm.

According to an embodiment, the silicon cap 204 can be patterned, using known lithography and etching techniques, prior to attaching the silicon cap 204 to the silicon substrate 202. Patterning the silicon cap 204 creates a light-transmitting region 220 around each of the integrated circuit dies 206, 208. In one embodiment, the light-transmitting region 220 may be filled with a transparent epoxy.

The transmitter die 208 is separated from the light sensor array 206 by a wall of the silicon cap 204 that is masked during the patterning process and therefore remains intact through the etching process that forms the first and second openings 224a, 224b. The silicon cap 204 between the first and second openings 224a, 224b serves as a light barrier preventing light emitted from the transmitter die 208 from propagating directly to the light sensor array 206 along a horizontal path. The first and second openings 224a, 224b may match, or extend beyond, the edges of the respective integrated circuit dies 206, 208. The first and second openings 224a, 224b can be patterned by optical lithography and etching, and then filled with the transparent epoxy such that light transmitted by the transmitter die 208 travels a distance of about 0.2 mm through the transparent epoxy before entering an ambient environment, e.g., air.

Figure 3:
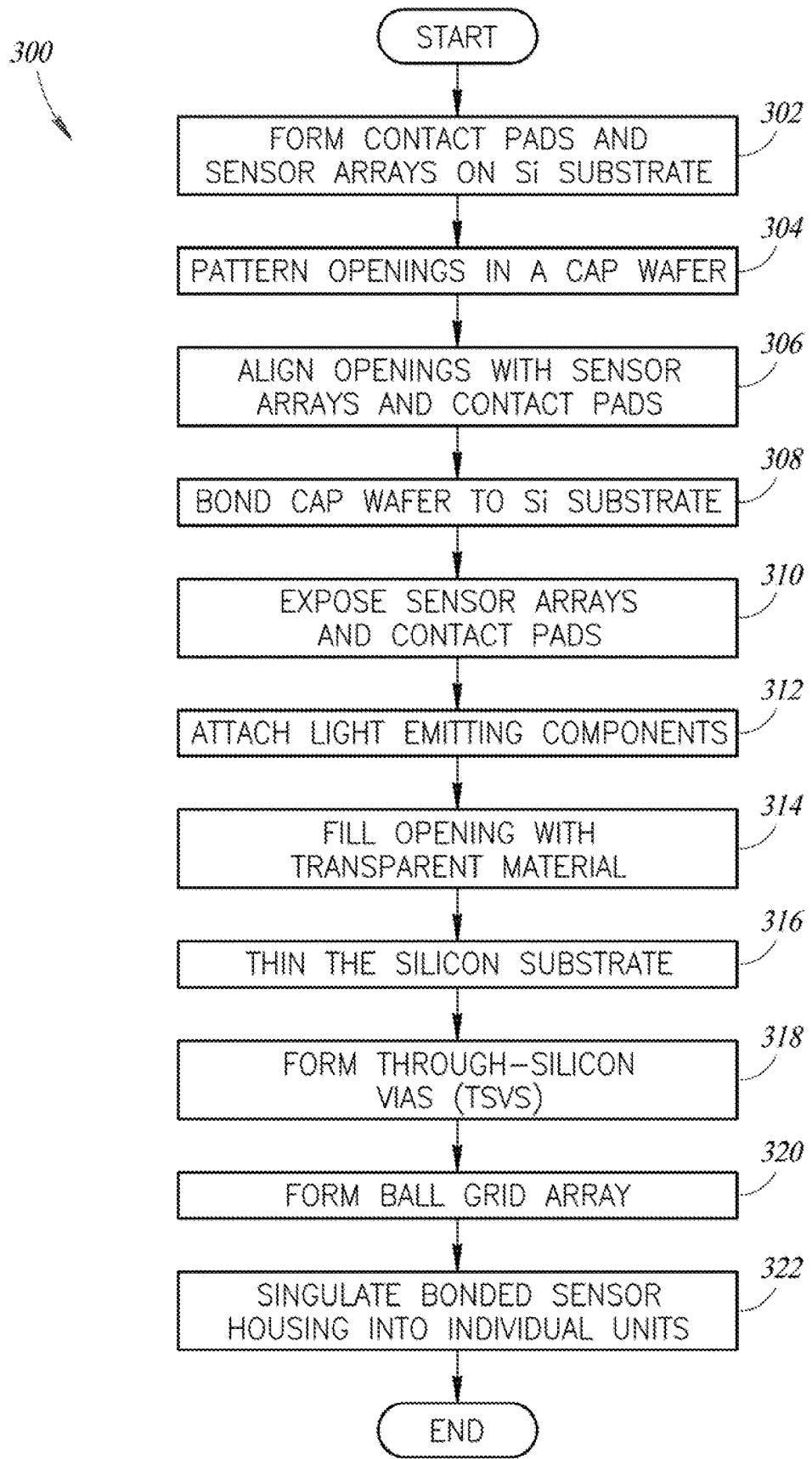
FIG. 3 is a process flow diagram showing steps in a method of fabricating an integrated circuit that includes the wafer level proximity sensor shown in FIG. 2, according to an embodiment as described herein.

FIG. 3 shows steps in a method 300 of fabricating wafer level proximity micro-sensor modules 200 according to one embodiment. Steps in the method 300 are further illustrated by the cross-sectional views shown in FIGS. 4-12, and described below.

Figure 4:
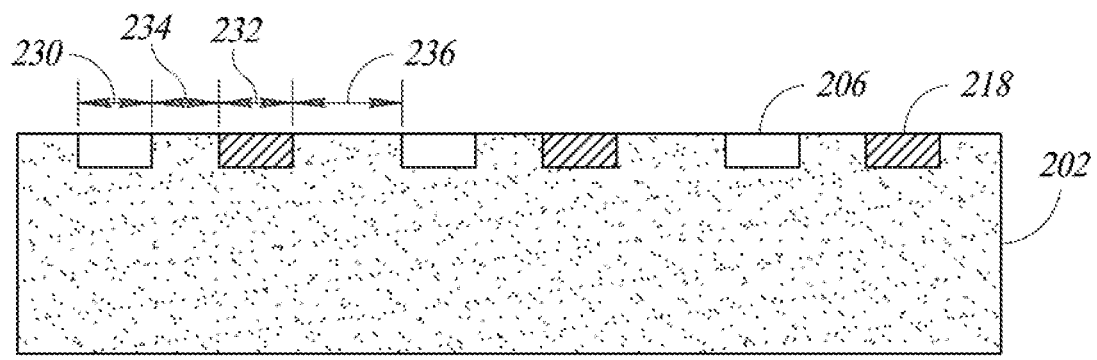
FIGS. 4-11 are cross-sectional views of the wafer level proximity sensor after various intermediate steps in the fabrication process shown in FIG. 3, according to an embodiment as described herein.

At 302, plurality of light sensor arrays 206 having widths 230 and an array of upper contact pads 218 having widths 232 are inlaid in the silicon substrate 202 in an alternating pattern, as shown in FIG. 4. Although the upper contact pads 218 are shown in the figures as extending to a same depth in the silicon substrate 202 as the light sensor arrays 206, the upper contact pads 218 may alternatively extend to a different depth than that of the sensor receiver dies, e.g., the upper contact pads 218 may be thinner than the light sensor arrays 206.

In one embodiment, a first array of trenches may be etched in the silicon substrate 202 to a first depth in a first etching step. The upper contact pads 218 may then be formed in the first array of trenches using a damascene plating process, as is known in the art. A second array of trenches may then be formed, in an alternating pattern with respect to the first array of trenches. Light sensor arrays 206 may be fabricated first, as integrated circuits in the silicon substrate 202, and then masked while the upper contact pads 218 are formed between each of the light sensor arrays 206. Alternatively, the light sensor arrays 206 may be placed in the second array of trenches.

A space 234 is formed between adjacent light sensor arrays 206 and the upper contact pads 218. A space 236 is formed between adjacent pairs of light sensor arrays 206 and the upper contact pads 218. The space 236 may be larger than the space 234, by design, to allow for singulation of the pairs of integrated circuit dies 206, 208.

Figure 5:
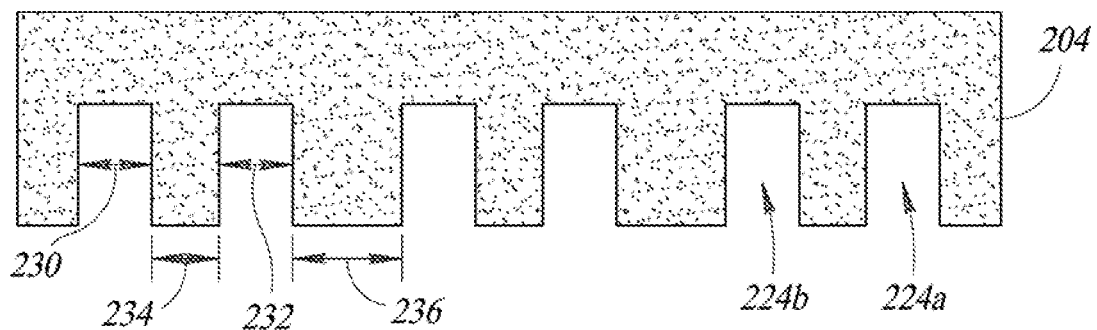

At 304, an array of openings 224a, 224b is formed in a silicon cap wafer, separate from the silicon substrate 202, to form silicon caps 204, as shown in FIG. 5. Widths 230, 232 of respective adjacent openings 224a, 224b are designed to match or exceed the widths of the upper contact pads 218 and the light sensor arrays 206, respectively. A space 234 between adjacent openings 224a, 224b is designed to match, or to be slightly smaller than, the space 234 between adjacent light sensor arrays 206 and the upper contact pads 218. A space 236 between pairs of the first and second openings 224a, 224b is designed to match, or to be slightly smaller than, the space 236 between pairs of the light sensor arrays 206 and the upper contact pads 218. The first and second openings 224a, 224b can be patterned using conventional optical lithography with photoresist masks, and silicon etching processes, for example. The first and second openings 224a, 224b generally have rectangular or square profiles. The first and second openings 224a, 224b may have profiles with rounded corners.

At 306, the first and second openings 224a, 224b are aligned with the lower contact pads 214 and the light sensor arrays 206, respectively.

Figure 6:
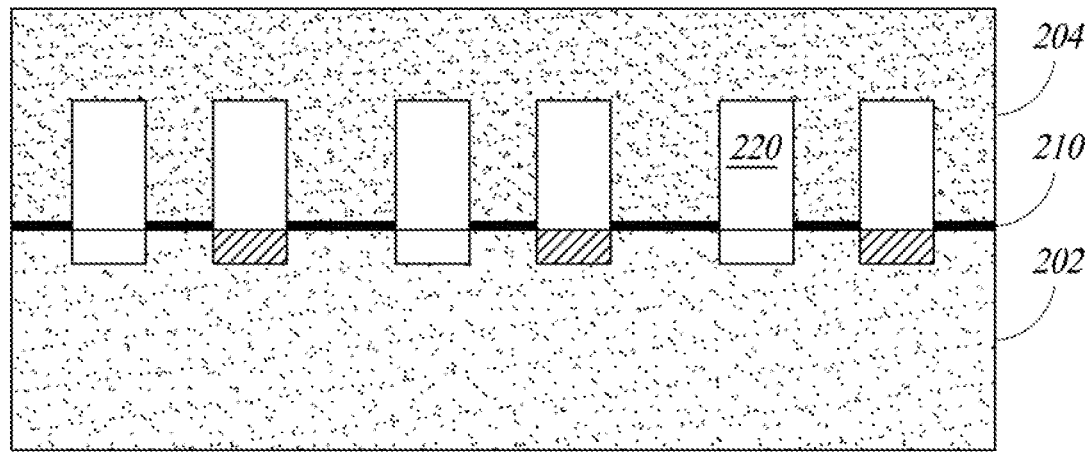

At 308, the silicon cap 204 is bonded to the silicon substrate 202 as shown in FIG. 6, using any available wafer-to-wafer bonding technology. The bonding process encloses the first and second openings 224a, 224b to form the light-transmitting regions 220. Bonding may entail application of the glue layer 210 to the lower surface 209 of the silicon cap 204, using a wafer-to-wafer bonding process that is well known in the art. The glue layer 210 can be made of, for example, a conventional epoxy bonding material. In one embodiment, the glue layer 210 is less than one micron thick.

Figure 7:
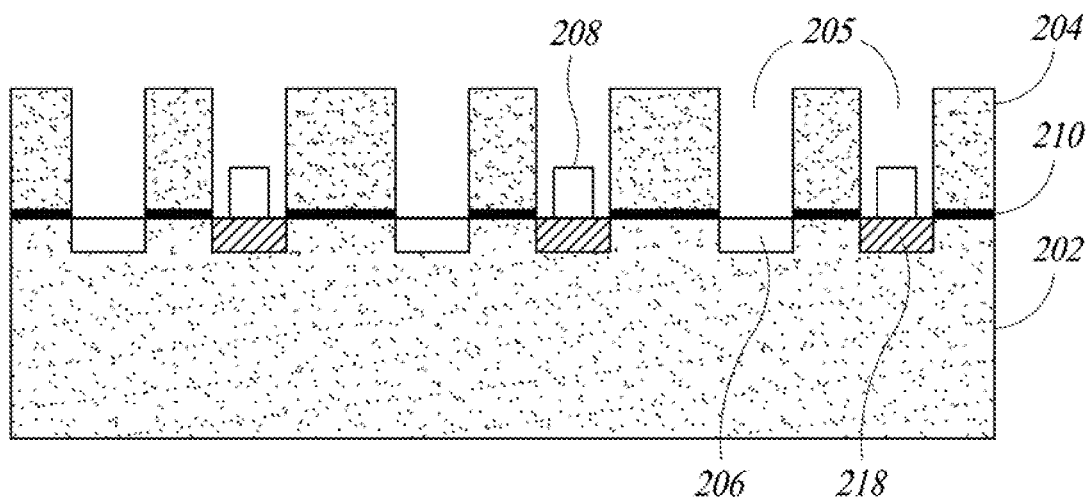

At 310, following wafer-to-wafer bonding, a back-grinding process is applied to the silicon cap 204 to expose the light-transmitting regions 220, as shown in FIG. 7. Such exposure will allow access to the upper contact pads 218, as well as permitting filling of the light-transmitting regions 220. The back-grinding process determines the amount of material that will separate the light source from air. Back-grinding of the silicon cap 204 can be done before or after bonding the silicon cap 204 to the silicon substrate 202.

At 312, the light-emitting transmitter dies 208 are lowered into the light-transmitting regions 220 for attachment to the upper contact pads 218, as shown in FIGS. 2 and 7.

Examples of transmitter dies include a semiconductor-based vertical cavity surface-emitting laser (VCSEL) diode. The transmitter dies 208 have a thickness of about 0.12 mm.

Figure 8:
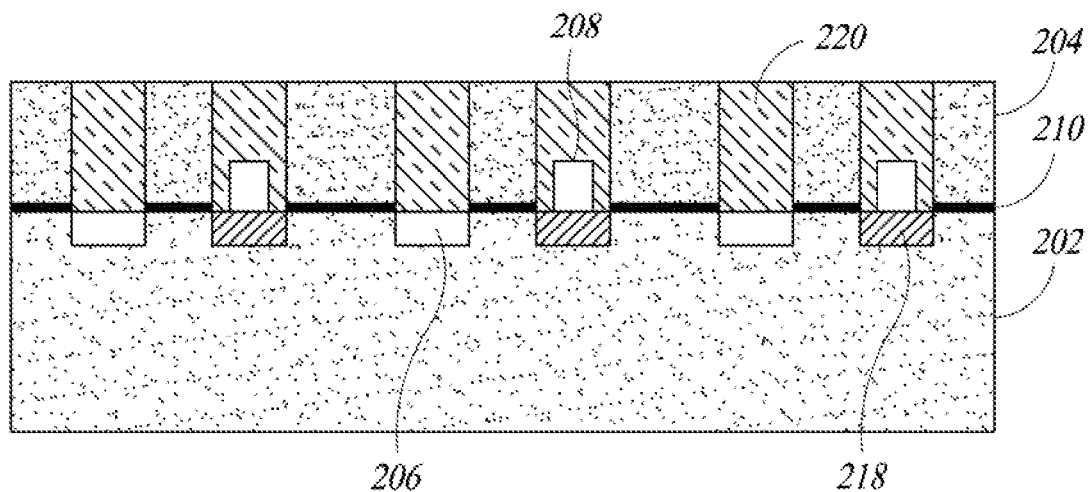

At 314, the light-transmitting regions 220 are filled with a transparent material, e.g., a transparent epoxy, as shown in FIG. 8.

Figure 9:
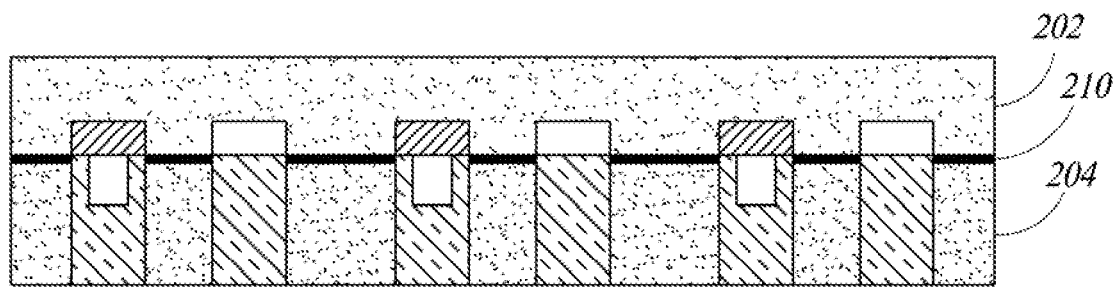

At 316, the silicon substrate 202 is thinned by a back-grinding process, as shown in FIG. 9.

Figure 10:
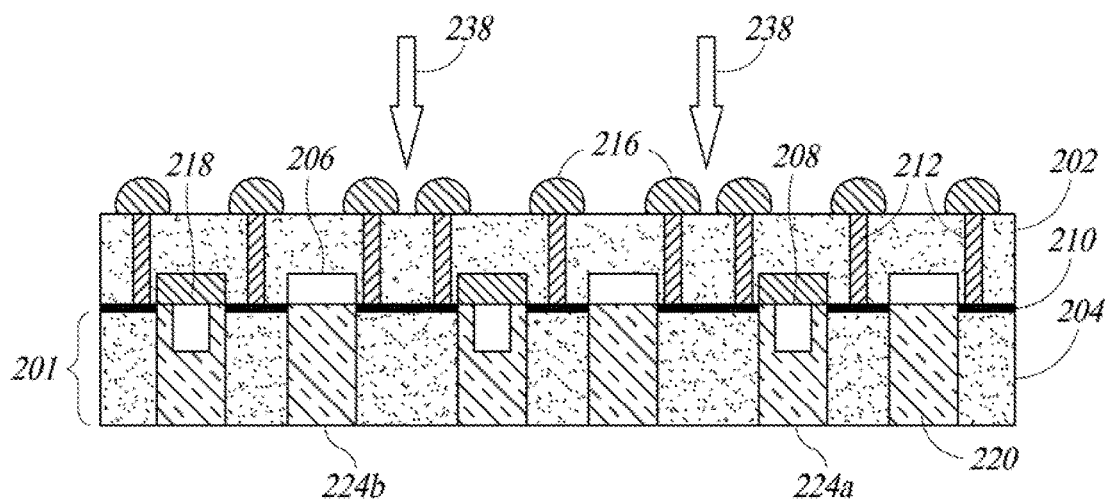

At 318, the through-silicon vias 212 and the lower contact pads 214 are formed in the silicon substrate 202, as shown in FIG. 10. The TSVs 212 extend all the way through the thickness of the silicon substrate 202 from the lower contact pads 214 to the glue layer 210. The through-silicon vias 212 may be formed using a through-silicon via process as is known in the art. The TSVs 212 have widths that are in the range of about 1.0-2.0 mm. The TSVs may connect directly to the transmitter dies 208 and light sensor arrays 206, or they may be coupled via traces in the silicon substrate 202 or traces on the transmitter dies 208 and light sensor arrays 206.

Figure 11:
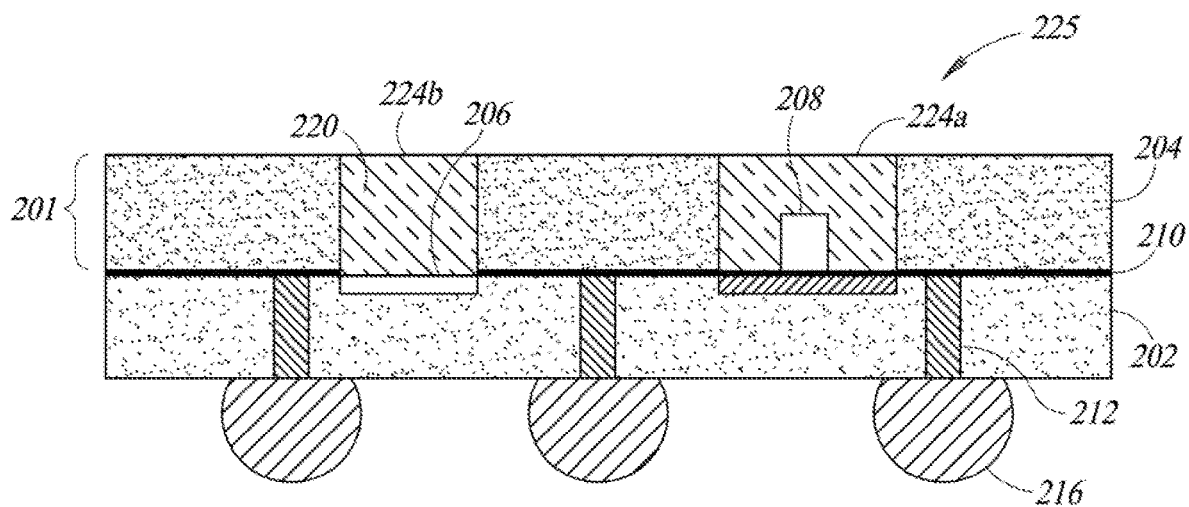

At 320, a ball grid array of solder balls 216 is formed on the lower surface 217 of the silicon substrate 202, as shown in FIG. 10. Each solder ball 216 may be coupled directly to a TSV 212 as shown in FIGS. 10-11. Alternatively, the solder ball 216 may be coupled to a TSV 212 by a lower contact pad 214 as shown in FIG. 2. A re-flow process may be applied to the solder balls 216 to provide a more robust connection to the lower contact pad 214.

At 322, the bonded wafers are singulated, or diced, to form individual wafer level proximity micro-sensor modules 200, as shown in FIGS. 10-11. FIG. 10 illustrates using a cutting tool 238 aligned with the spaces 236 to separate the wafer level proximity micro-sensor modules 200. The cutting tool 238 may be a saw, a laser beam, or any other tool suitable for wafer singulation. Each one of the singulated wafer level proximity micro-sensor modules 200 shown in FIG. 11 includes one transmitter die 208, one light sensor array 206, a plurality of TSVs, and a plurality of solder balls 216.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A package, comprising:
a first outer surface;
a second outer surface;
a thinned silicon substrate having a first surface and a second surface opposite the first surface, the second outer surface being formed by the second surface of the thinned silicon substrate;
a plurality of through silicon vias extending through the thinned silicon substrate, the plurality of through silicon vias extending from the first surface to the second surface, end surfaces of the plurality of through silicon vias being at the second surface and being coplanar with the second surface;
a light sensor in the first surface of the silicon substrate;
a contact pad in the first surface of the silicon substrate;
a light emitter structurally and electrically coupled to the contact pad; and
a cap of silicon having a first surface and a second surface that is opposite to the first surface, the first surface of the cap being bonded to the first surface of the silicon substrate, the first outer surface being formed in part by the second surface of the cap, the cap of silicon including:
a first opening over the light emitter, the first opening extending completely through the cap and having a width adjacent the light emitter that is greater than a width of the light emitter, the contact pad being within the first opening; and
a second opening over the light sensor, the second opening having a width substantially equal to a width of the light sensor;
a transparent epoxy material in the first opening and the second opening, the transparent epoxy material in each of the first and second openings having a surface substantially co-planar with the second surface of the cap of silicon, the first outer surface including the second surface of the cap of silicon and the surfaces of the transparent epoxy material, the transparent epoxy material being directly on and physically coupled to the light sensor, the light emitter, and the contact pad; and
a plurality of solder balls on the second surface of the thinned silicon substrate, the plurality of solder balls are electrically and physically coupled to the end surfaces of ones of the plurality of through silicon vias.

2. The package of claim 1 wherein:
the thinned silicon substrate has a first dimension that extends from the first surface of the thinned silicon substrate to the second surface of the thinned silicon substrate, the first dimension is in the range of 0.2 and 0.3 millimeters; and
the cap of silicon has a second dimension extending between the first surface of the cap of silicon and the second surface of the cap of silicon, the second dimension is in the range of 0.2 and 0.3 millimeters.

3. The package of claim 1 wherein the cap of silicon is bonded to the silicon substrate by an epoxy bonding layer having a thickness in the range of 0.5 and 0.15 micrometers.

4. The package of claim 1 wherein the light emitter is a light emitting diode mounted directly on the contact pad.

5. The package of claim 1 wherein the light emitter is a laser diode on the contact pad.

6. The package of claim 1 wherein a thickness of the bonded cap of silicon and silicon substrate is less than 0.7 millimeters.

7. The package of claim 1 wherein the cap of silicon provides a light barrier between the first opening and the second opening.

8. The package of claim 1, further comprising:
at least a first one of the plurality of through silicon vias electrically connects the light sensor to a first solder ball of the plurality of solder balls; and
at least a second one of the plurality of through silicon vias electrically connects the contact pad to a second solder ball of the plurality of solder balls.

9. A device, comprising:
a package that includes a first outer surface opposite to a second outer surface and a first outer edge opposite to a second outer edge, the package including:
a thinned silicon substrate having a first surface and a second surface, the second surface being a back-grinded surface;
a light sensor at the first surface of the silicon substrate, the light sensor having a third surface substantially co-planar with the first surface of the silicon substrate;
a first contact pad at the first surface of the silicon substrate, the first contact pad being spaced from the light emitter;
a light emitter coupled to the first contact pad;
a second contact pad at the second surface of the silicon substrate;
a cap bonded to the first surface of the silicon substrate, the cap having a fourth surface facing away from the silicon substrate, the cap including a first opening aligned with and exposing the light emitter and a second opening aligned with and exposing the light sensor;
a first transparent material in the first opening and directly on the light emitter, the first transparent material filling the first opening and being coplanar with the fourth surface of the cap, the first transparent material covering and being physically coupled to a surface of the first contact pad; and
a second transparent material in the second opening, the second transparent material is directly on and physically coupled to the light sensor, the second transparent material filling the second opening and being coplanar with the fourth surface of the cap, the first outer surface of the package being the fourth surface of the cap and the coplanar surfaces of the first and second transparent materials, the second outer surface of the package being the back-grinded second surface of the thinned silicon substrate, and the first and second outer edges of the package being coplanar edges of the cap and the silicon substrate.

10. The device of claim 9 wherein the light emitter is an LED.

11. The device of claim 9 wherein the cap is a silicon cap that is bonded to the silicon substrate at three locations.

12. The device of claim 11 wherein the three locations include a position adjacent to the first contact pad, a position between the first contact pad and the light sensor and a position adjacent to the light sensor.

13. The device of claim 9 wherein the electrical connection is a silicon through hole.

14. The device of claim 9, further comprising:
at least one solder ball coupled to the second contact pad; and
an electrical connection extending from the first contact pad to the second contact pad and integrated with the silicon substrate.

15. The device of claim 9, wherein the first opening has a constant width through the cap that is greater than the width of the light emitter.

16. A wafer level proximity micro-sensor module, comprising:
a back-grinded silicon substrate having a first surface opposite a second surface;
a light sensor at the first surface of the back-grinded silicon substrate, the light sensor including a surface substantially co-planar with the first surface of the back-grinded silicon substrate;
a first contact pad at the first surface of the silicon substrate;
a light emitter coupled to the first contact pad;
a cap coupled to the first surface of the silicon substrate, the cap including a third surface opposite to the first surface of the silicon substrate, a first opening aligned with the light emitter and a second opening aligned with the light sensor, the first opening having a width proximate the light emitter that is greater than a width of the light emitter; and
a first transparent portion fills the first opening and covers the light emitter, a second transparent portion fills the second opening and covers the light sensor, the first transparent portion has a fourth surface, the second transparent portion has a fifth surface, and the fourth surface and the fifth surface are substantially flush with the third surface of cap, the first transparent portion is in direct physical contact with a surface of the first contact pad, and the second transparent portion is in direct physical contact with the light sensor;
wherein the back-grinded substrate and the cap are singulated to yield the wafer level proximity micro-sensor module, and a thickness of the wafer level proximity micro-sensor module extends between the second surface of the back-grinded silicon substrate and the third surface of the cap, the thickness is in the range of 0.4 and 0.6 millimeters.

17. The wafer level proximity micro-sensor module of claim 16 wherein a width of the second opening matches a width of the light sensor.

18. The wafer level proximity micro-sensor module of claim 16 further comprising:
a second contact pad formed between the first surface and the second surface of the silicon substrate; and
at least one solder ball coupled to the second contact pad.

19. The wafer level proximity micro-sensor module of claim 16 wherein transparent portions overlap the light emitter in the first opening and the light sensor in the second opening.

* * * * *